United States Patent
Katsuma

(10) Patent No.: US 11,253,926 B2
(45) Date of Patent: Feb. 22, 2022

(54) COATED TOOL AND CUTTING TOOL

(71) Applicant: KYOCERA CORPORATION, Kyoto (JP)

(72) Inventor: Tadashi Katsuma, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 192 days.

(21) Appl. No.: 16/498,406

(22) PCT Filed: Mar. 23, 2018

(86) PCT No.: PCT/JP2018/011810
§ 371 (c)(1),
(2) Date: Sep. 27, 2019

(87) PCT Pub. No.: WO2018/181034
PCT Pub. Date: Oct. 4, 2018

(65) Prior Publication Data
US 2020/0246876 A1    Aug. 6, 2020

(30) Foreign Application Priority Data

Mar. 29, 2017 (JP) .............................. JP2017-065233

(51) Int. Cl.
| | |
|---|---|
| *B23B 27/14* | (2006.01) |
| *C23C 16/34* | (2006.01) |
| *C23C 16/36* | (2006.01) |
| *C23C 16/40* | (2006.01) |

(52) U.S. Cl.
CPC ............ *B23B 27/148* (2013.01); *C23C 16/34* (2013.01); *C23C 16/36* (2013.01); *C23C 16/403* (2013.01); *B23B 2228/105* (2013.01)

(58) Field of Classification Search
CPC .. B23B 27/14; B23B 27/148; B23B 2228/105
USPC ........................................ 428/698, 701, 702
See application file for complete search history.

(56) References Cited

U.S. PATENT DOCUMENTS

2012/0202032 A1    8/2012  Tatsuoka

FOREIGN PATENT DOCUMENTS

| JP | 2000-071108 | * | 3/2000 |
|---|---|---|---|
| JP | 2003211306 A | | 7/2003 |
| JP | 2012-187659 A | | 10/2012 |
| JP | 2013126709 A | | 6/2013 |
| JP | 2015-182209 A | | 10/2015 |
| JP | 2015-188995 A | | 11/2015 |

* cited by examiner

*Primary Examiner* — Archene A Turner
(74) *Attorney, Agent, or Firm* — Viering, Jentschura & Partner mbB

(57) ABSTRACT

A coated tool may include a base member including a first surface, and a coating layer located at least on the first surface of the base member. The coating layer may include a first layer and a second layer. The first layer may be located on the first surface and may include a titanium compound. The second layer may be contactedly located on the first layer and may include aluminum oxide. The coating layer may include a plurality of voids located side by side in the first layer in a direction along a boundary between the first layer and the second layer in a cross section orthogonal to the first surface.

7 Claims, 7 Drawing Sheets

COATED TOOL AND CUTTING TOOL

CROSS-REFERENCE TO RELATED APPLICATIONS

This application is a national stage entry according to 35 U.S.C. 371 of PCT Application No. PCT/JP2018/011810 filed on Mar. 23, 2018, which claims priority to Japanese Application No. 2017-065233 filed on Mar. 29, 2017, which are entirely incorporated herein by reference.

TECHNICAL FIELD

The present disclosure relates to a coated tool for use in a cutting process.

BACKGROUND

As a coated tool for use in the cutting process, such as a turning process and a milling process, a coated tool may be discussed in, for example, Patent Document 1 (Patent Document 1: Japanese Unexamined Patent Publication No. 2015-182209). The coated tool discussed in Patent Document 1 may include a configuration in which a coating layer is located on a surface of a base member composed of cemented carbide or the like. The coating layer may include a layer (titanium compound layer) including a compound of titanium (Ti), and a layer (aluminum oxide layer) including aluminum oxide ($Al_2O_3$). In the coated tool discussed in Patent Document 1, a plurality of voids may be formed at an interface between the titanium compound layer and the aluminum oxide layer. Impact relaxation effect may be obtainable because of the plurality of voids.

Although the impact relaxation effect may be obtainable by including the voids, the voids may be located at the boundary between two layers that are different in composition, and consequently bondability between these layers may be lowered. There has hence been a need for a coated tool having good bondability while keeping high impact resistance.

SUMMARY

A coated tool according to a non-limiting embodiment may include a base member including a first surface and a coating layer located at least on the first surface of the base member. The coating layer may include a first layer and a second layer. The first layer may be located on the first surface and may include a titanium compound. The second layer may be contactedly located on the first layer and may include aluminum oxide. The coating layer may include a plurality of voids located side by side in the first layer in a direction along a boundary between the first layer and the second layer in a cross section orthogonal to the first surface.

DETAILED DESCRIPTION

Figure 1:
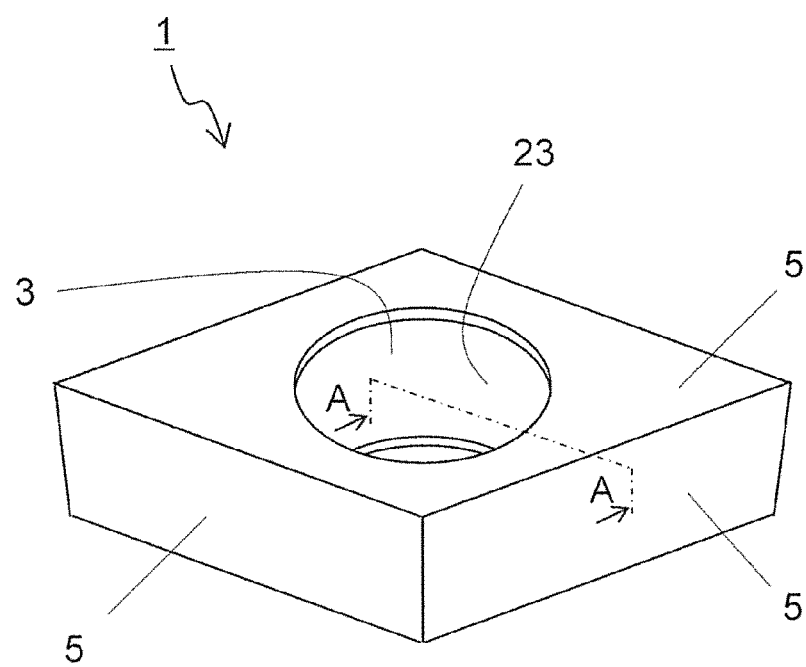
FIG. 1 is a perspective view illustrating a coated tool according to a non-limiting embodiment.

A coated tool 1 according to a non-limiting embodiment is described in detail below with reference to the drawings. For the sake of description, each of the drawings referred to in the following illustrates, in a simplified form, only main members necessary for describing the non-limiting embodiments. Hence, the coated tool is capable of including any structural member not illustrated in the drawings referred to. Dimensions of the members in each of the drawings are not ones which faithfully represent dimensions of actual structural members and dimension ratios of these members.

<Coated Tool>

Figure 2:
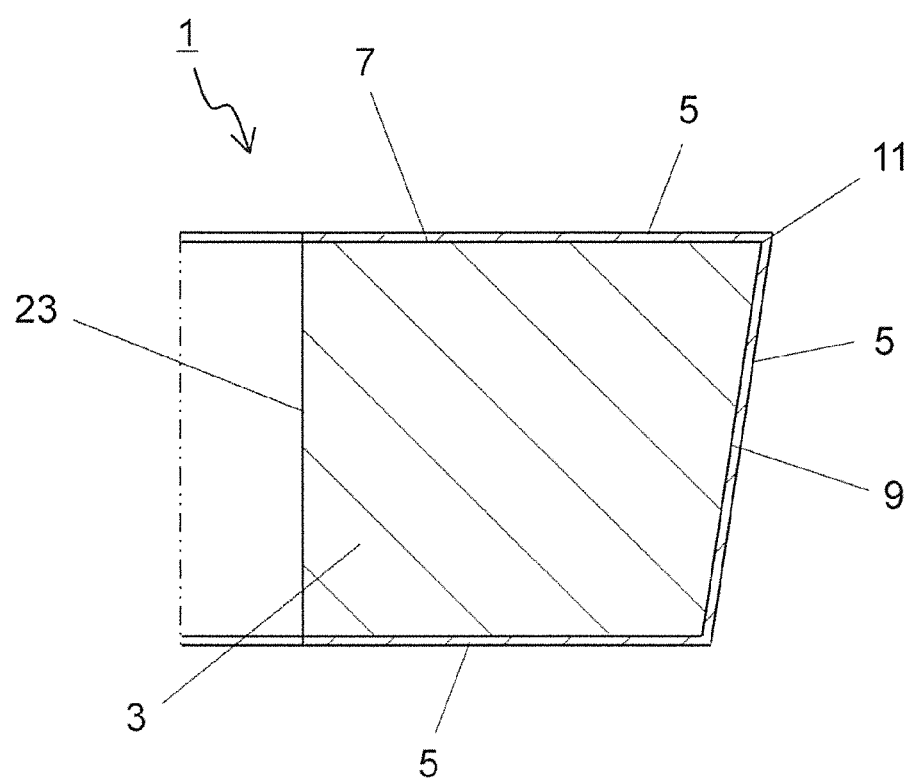
FIG. 2 is a sectional view taken along line A-A in the coated tool illustrated in FIG. 1.

The coated tool 1 according to a non-limiting embodiment includes a base member 3 and a coating layer 5 as illustrated in FIGS. 1 and 2. The base member 3 includes a first surface 7 (an upper surface in FIG. 2), a second surface 9 adjacent to the first surface 7 (a side surface in FIG. 2), and a cutting edge 11 located at least on a part of a ridge line where the first surface 7 intersects with the second surface 9 according to a non-limiting embodiment.

The base member 3 includes a quadrangular plate shape, and the first surface 7 includes a quadrangular shape according to a non-limiting embodiment. The number of the second surfaces 9 is therefore four. At least a part of the first surface 7 is a rake surface region, and at least a part of the second surface 9 is a flank surface region according to a non-limiting embodiment. The shape of the base member 3 is not limited to the quadrangular plate shape. For example, the first surface 7 may include a triangular, pentagonal or hexagon shape. Alternatively, the base member 3 may include a columnar shape besides the plate shape.

The coating layer 5 is located at least on the first surface 7 of the base member 3. The coating layer 5 may be located only on the first surface 7 or on a surface other than the first surface in the base member 3. The coating layer 5 is also located on the second surface 9 in addition to the first surface 7 according to a non-limiting embodiment. The coating layer 5 is included for the purpose of improving characteristics of the coated tool 1 during a cutting process, such as wear resistance and chipping resistance.

Figure 3:
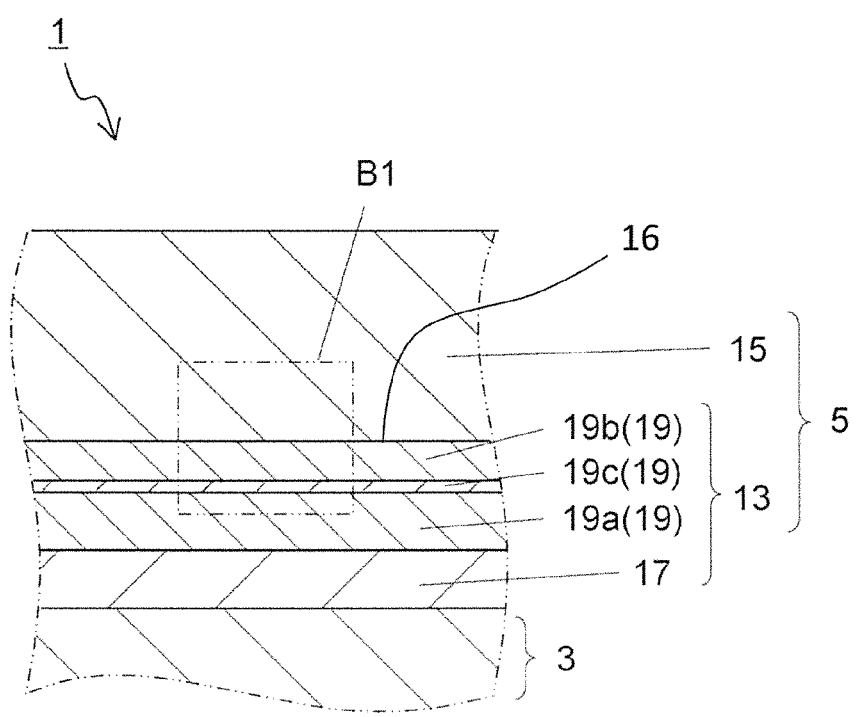
FIG. 3 is an enlarged view in the vicinity of a coating layer in the coated tool illustrated in FIG. 2.

The coating layer 5 includes a first layer 13 and a second layer 15 according to a non-limiting embodiment as illustrated in FIG. 3. The first layer 13 is located on the first surface 7 and includes a titanium compound. The second layer 15 is contactedly located on the first layer 13 and includes aluminum oxide ($Al_2O_3$).

Examples of the titanium compound included in the first layer 13 include titanium carbide, nitride, oxide, carbonitride, carbon oxide and oxycarbonitride. The first layer 13 may be configured to include only one of the above compounds or, alternatively, may be configured to include a plurality of kinds of the above compounds.

The first layer 13 may be made into a single layer or, alternatively, may include a configuration in which a plurality of layers are laminated one on another as long as it includes a titanium compound. For example, the first layer 13 may include a configuration in which a layer 17 including titanium nitride and a layer 19 including titanium carbonitride are laminated one on another. Bondability between the base member 3 and the first layer 13 becomes higher if the first layer 13 includes the layer 17 including titanium nitride.

The coating layer 5 may be composed only of the first layer 13 and the second layer 15 or, alternatively, may include a layer other than these layers. For example, a different layer may be interposed between the base member 3 and the first layer 13 or, alternatively, a different layer may be located on the second layer 15.

The layer 19 including titanium carbonitride may include a configuration in which a plurality of regions different in composition are laminated one on another. For example, the layer including titanium carbonitride may include a configuration in which a first region 19a including so-called MT (moderate temperature)-titanium carbonitride and a second region 19b including so-called HT (high temperature)-titanium carbonitride are laminated one on another. A boundary between the layers and a boundary between the regions can be determined, for example, by observing an electron microscope (SEM: Scanning Electron Microscope) photograph or a transmission electron microscope (TEM: Transmission Electron Microscope) photograph.

In cases where the first layer 13 includes the first region 19a and the second region 19b, the first layer 13 may further include an intermediate region 19c between the first region 19a and the second region 19b.

Examples of the aluminum oxide included in the second layer 15 include α-alumina (α-$Al_2O_3$), γ-alumina (γ-(α-$Al_2O_3$) and κ-alumina (κ-$Al_2O_3$). If the second layer 15 includes α-alumina of these, heat resistance of the coated tool 1 can be enhanced. The second layer 15 may be configured to include only one of the above compounds or, alternatively, may include a plurality of kinds of the above compounds.

Identification of the aluminum oxide included in the second layer 15 from among the above compounds can be evaluated, for example, by carrying out X-ray diffraction (XRD) analysis and by observing a distribution of peak values.

A content ratio of the titanium compound in the first layer 13 and a content ratio of the aluminum oxide in the second layer 15 are not limited to a specific value. A non-limiting embodiment thereof is a configuration in which the first layer 13 includes the titanium compound as a main component, and the second layer 15 includes the aluminum oxide as a main component. The term "main component" denotes a component having a largest value in mass % among values of other components.

The first layer 13 may include a component other than the titanium compound, and the second layer 15 may include a component other than the aluminum oxide. For example, bondability between the first layer 13 and the second layer 15 is improved if the first layer 13 includes the aluminum oxide and the second layer 15 includes the titanium compound.

Figure 4:
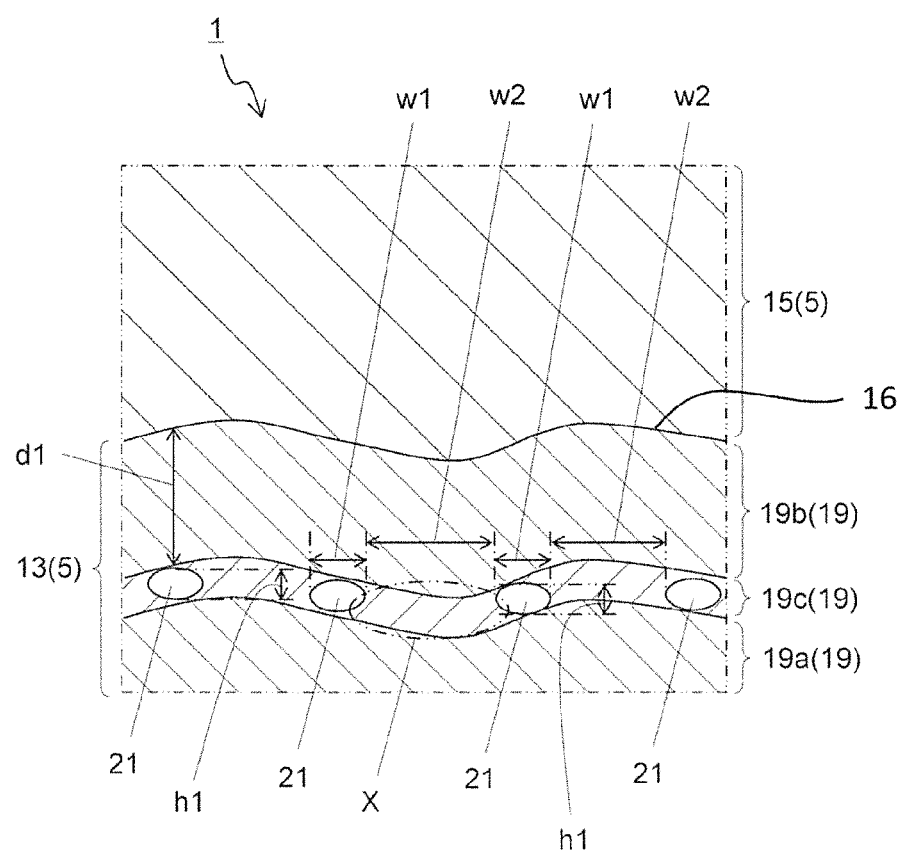
FIG. 4 is an enlarged view illustrating a non-limiting embodiment of a region B1 illustrated in FIG. 3.

The coating layer 5 according to a non-limiting embodiment includes the voids 21 in an interior of the first layer 13 as illustrated in FIG. 4. Specifically, the coating layer 5 includes the plurality of voids 21 located side by side in a direction along the boundary 16 between the first layer 13 and the second layer 15 in a cross section orthogonal to the first surface 7 of the base member 3.

It is therefore possible to obtain the impact relaxation effect because of the voids 21 while reducing degradation of the bondability between the first layer 13 and the second layer 15.

Additionally, the plurality of voids 21 are located side by side in the direction along the boundary 16 between the first layer 13 and the second layer 15 according to a non-limiting embodiment. This leads to a narrower distance between the voids 21 than, for example, cases where the plurality of voids 21 are dispersed disorderly throughout the first layer 13. A portion X located between the voids 21 adjacent to each other in the first layer 13 (refer to as a first portion X for the sake of convenience) is therefore likely to be deformed, thereby making it possible to enhance the impact resistance while ensuring strength of the first layer 13. Consequently, the coated tool 1 according to a non-limiting embodiment has good bondability while keeping the enhanced impact resistance.

In cases where an average value of widths w1 of the voids 21 in a direction parallel to the first surface 7 is smaller than a distance between the voids 21 adjacent to each other, namely, an average value of widths w2 at the first portion X in the cross section orthogonal to the first surface 7, high impact resistance in the voids 21 is obtainable while reducing degradation of strength of the first portion X.

Because the titanium compound included in the first layer 13 is a material having high rigidity and low toughness, a crack is more likely to occur at the first portion X as the width w2 of the first portion X becomes smaller. It is easy to ensure the widths w2 of the first portion X if the voids 21 and the average value of the widths of the first portion X have the above relationship. Strength of the first portion X is therefore less likely to degrade, thus leading to the enhanced impact resistance in the voids 21.

In evaluating the average value of the widths w1 of the voids 21 in the direction parallel to the first surface 7, it is unnecessary to evaluate the widths w1 of all the voids 21 existing in the cross section orthogonal to the first surface 7, but the average value may be evaluated by an average value of the widths w1 of approximately 5 to 10 voids 21 located side by side in the cross section. For example, a 10 μm square region including the boundary 16 between the first layer 13 and the second layer 15 may be extracted in the cross section orthogonal to the first surface 7, and the widths w1 of the voids 21 in the region may be measured. An average value of the widths w2 of the first portion X may be evaluated by an average value of distances between approximately 5 to 10 voids 21 located side by side in the cross section. There may be other cases of determining an average value in the present disclosure. An average value of approximately 5 to 10 values may be obtained in each of the cases.

Figure 5:
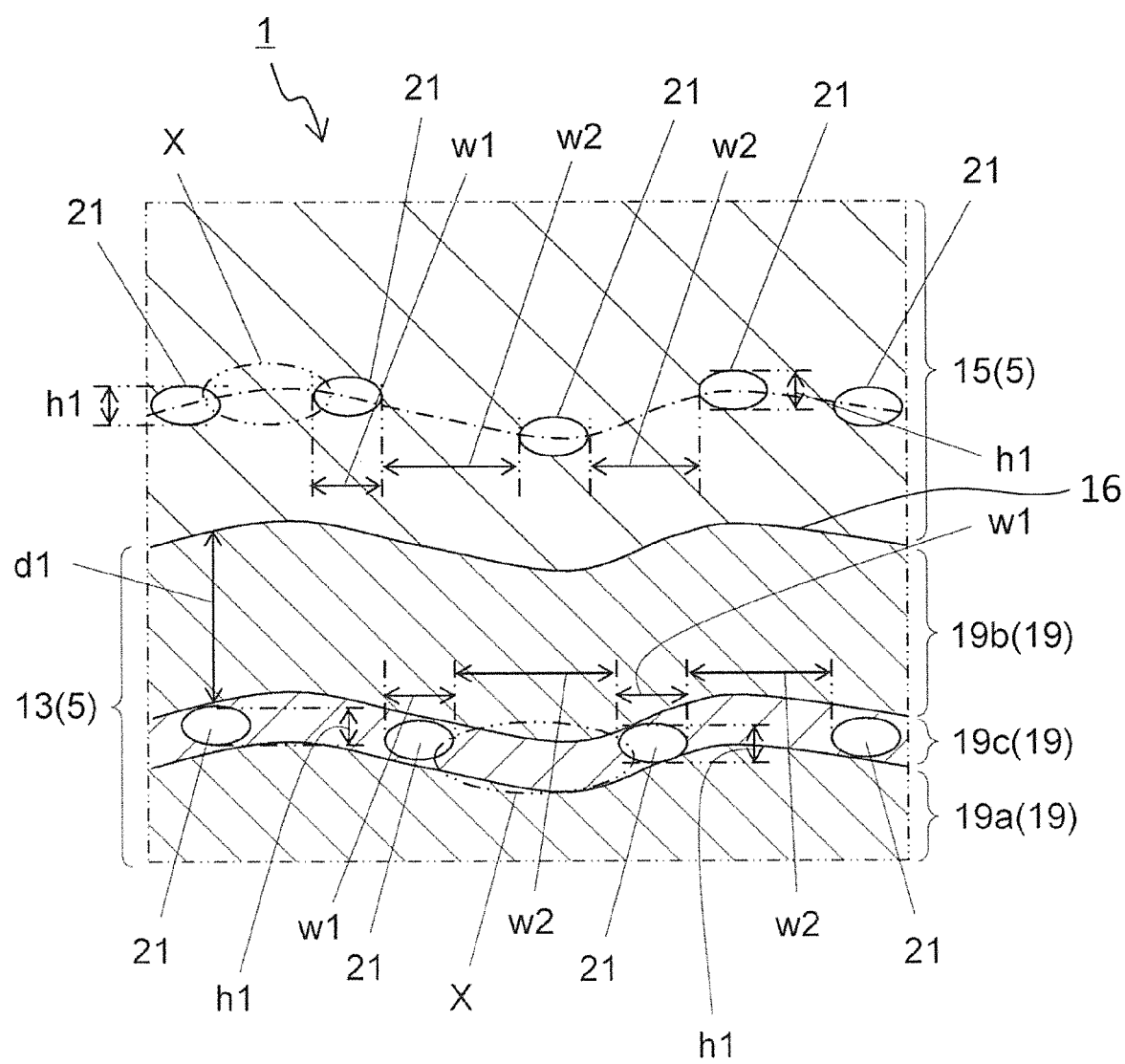
FIG. 5 is an enlarged view illustrating another non-limiting embodiment of the region B1 illustrated in FIG. 3.

The voids 21 may be exist in the first layer 13. Besides the configuration in which the voids 21 are located in the first layer 13 as illustrated in FIG. 4, it is possible to employ, for example, a configuration in which the voids 21 are located in each of the first layer 13 and the second layer 15 as illustrated in FIG. 5. An imaginary line segment along the boundary 16 between the first layer 13 and the second layer 15 is indicated by a chain line in FIG. 5, and the voids 21 located in the second layer 15 may be located along the boundary 16 between the first layer 13 and the second layer 15.

The phrase that "the voids 21 are located along the boundary 16 between the first layer 13 and the second layer 15" denotes that distances from the plurality of voids 21 to the boundary 16 between the first layer 13 and the second layer 15 fall within a range of ±20% of an average value thereof. FIG. 5 is an enlarged view of the cross section and illustrates a region equivalent to FIG. 4.

In cases where the first layer 13 includes titanium carbonitride as a titanium compound and the second layer 15 includes α-alumina as aluminum oxide from the viewpoint of heat resistance and durability of the coated tool 1, the durability of the coated tool 1 can be further enhanced if the plurality of voids 21 are located in the first layer 13.

The reason for this is as follows. Hardness of the titanium carbonitride is higher but impact resistance thereof is lower than that of α-alumina. Therefore, if the voids 21 are located in the first layer 13, impact resistance because of the voids 21 can be enhanced in the first layer 13, and the durability of the coated tool 1 can be further enhanced.

Although no particular limitations are imposed on size of the voids 21, the size is settable to, for example, 20-200 nm. The impact relaxation effect because of the voids 21 can be enhanced if the size of the voids 21 is 20 nm or more. It is easy to maintain the strength of the first layer 13 if the size of the voids 21 is 200 nm or less. The term "size of the voids 21" denotes a maximum value of the widths w1 of the voids 21 in the cross section orthogonal to the first surface 7.

No particular limitations are imposed on shape of the voids 21. The impact resistance can be further enhanced while reducing a ratio of the voids 21 if the width w1 in the direction parallel to the first surface 7 is larger than a height h1 in the direction orthogonal to the first surface 7, in other words, if the average value of the widths w1 of the voids 21 in the direction parallel to the first surface 7 is larger than an average value of the heights h1 of the voids 21 in the direction orthogonal to the first surface 7 in the cross section orthogonal to the first surface 7. The reason for this is as follows.

During a cutting process of a workpiece for the purpose of manufacturing a cut product, the coating layer 5 is susceptible to a cutting load in the direction orthogonal to the first surface 7. If the voids 21 have such a shape that the width w1 in the direction parallel to the first surface 7 is larger than the height h1 in the direction orthogonal to the first surface 7, the cutting load can be absorbed in a wide range of the voids 21 without making the voids 21 larger than necessary. This makes it possible to further enhance the impact resistance while reducing the ratio of the voids 21. The term "heights h1 of the voids 21 in the direction orthogonal to the first surface 7" denotes a maximum value of the heights h1 of the voids 21 in the direction orthogonal to the first surface 7.

Specifically, the cutting load tends to be absorbed in a wide range of the voids 21 if a ratio of the average value of the heights h1 of the voids 21 in the direction orthogonal to the first surface 7 to the average value of the widths w1 of the voids 21 in the direction parallel to the first surface 7 is 1.2 or more. Additionally, if the above ratio is 2 or less, it is easy to ensure a deformation amount of the voids 21 in the direction orthogonal to the first surface 7, thus leading to stable absorption of the cutting load in the voids 21.

If the average value of the heights h1 of the voids 21 in the direction orthogonal to the first surface 7 is smaller than Rz where Rz is a maximum height of the boundary between the first surface 7 and the second surface 9 in the cross section orthogonal to the first surface 7, it is easy to reduce degradation of the durability of the coating layer 5 according to a non-limiting embodiment.

The coated tool 1 according to a non-limiting embodiment has the enhanced impact resistance because of deformation of the first portion X located between the voids 21 adjacent to each other and because of deformation of the plurality of voids 21 in the first layer 13. If an average value of widths of the voids 21 in the direction orthogonal to the first surface 7 is smaller than Rz, an imaginary line connecting the voids 21 adjacent to each other is indicated by a zigzag shape that is bent larger than the width of the void 21.

In cases where the imaginary line is indicated by the above shape, even if a crack occurs at one of the first portions X, the crack is less likely to propagate to the first portion X located adjacent to the first portion X with the crack. The durability of the coating layer 5 is therefore less likely to degrade.

The durability of the coating layer 5 is also less likely to degrade if an average value of distances d1 from the voids 21 to the boundary 16 between the first layer 13 and the second layer 15 is larger than an average value of widths w2 of the first portions X in the cross section orthogonal to the first surface 7. The term "distance d1 from the voids 21 to the boundary 16 between the first layer 13 and the second layer 15" denotes a minimum value of the distance to the boundary 16 in the voids 21.

The reason for this is as follows. Because, in comparison with the first portions X, the above case ensures a sufficient distance from the voids 21 to the boundary 16 between the first layer 13 and the second layer 15, even if a crack occurs at one of the first portions X, the crack is less likely to reach the boundary 16 between the first layer 13 and the second layer 15. The bondability between the first layer 13 and the second layer 15 is less likely to degrade because the crack is less likely to reach the boundary 16 between the first layer 13 and the second layer 15.

The voids 21 are located in the first layer 13 and located away from the boundary between the first layer 13 and the second layer 15. The bondability between the first layer 13 and the second layer 15 is less likely to degrade while achieving enhanced impact resistance in the coating layer 5 if an average value of the distances d1 from the voids 21 to the boundary 16 between the first layer 13 and the second layer 15 is larger than an average value of the heights h1 of the voids 21 in the direction orthogonal to the first surface 7 in the cross section orthogonal to the first surface 7.

The reason for this is as follows. Because, in comparison with the size of the voids 12, the distance from the voids 21 to the boundary 16 between the first layer 13 and the second layer 15 can be sufficiently ensured, even if the voids 21 are deformed due to absorption of the cutting load, the boundary 16 between the first layer 13 and the second layer 15 is not deformed, or the deformation amount becomes sufficiently small. The bondability between the first layer 13 and the second layer 15 is less likely to degrade because the boundary 16 between the first layer 13 and the second layer 15 is less subjected to large deformation.

Examples of material of the base member 3 include inorganic materials, such as cemented carbide, cermet and ceramics, according to a non-limiting embodiment. The material of the base member 3 is not limited to these materials.

Examples of composition of cemented carbide include WC (tungsten carbide)-Co, WC—TiC (titanium carbide)-Co and WC—TiC—TaC (tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride).

The base member 3 includes a through hole 23 that passes through the first surface 7 and a surface located on an opposite side of the first surface 7 according to a non-limiting embodiment. The through hole 23 is usable for inserting a fixing member that is intended to fix the coated tool 1 to a holder. Examples of the fixing member include a screw and a clamping member.

The size of the base member 3 is not particularly limited. For example, a length of one side of the first surface 7 is settable to approximately 3-20 mm according to a non-limiting embodiment. A height from the first surface 7 to the surface located on the opposite side of the first surface 7 is settable to approximately 5-20 mm.

<Manufacturing Method>

A non-limiting embodiment of a method for manufacturing the coated tool is described below.

Firstly, a mixed powder is manufactured by suitably adding metal powder, carbon powder or the like to inorganic powder selected from carbide, nitride, carbonitride and oxide or the like, which are capable of forming a hard alloy constituting a base member 3 by sintering, and then by mixing them together. Subsequently, a molded body is manufactured by molding the mixed powder into a predetermined tool shape with the use of a known molding method. Examples of the molding method include press molding, casting molding, extrusion molding and cold isostatic pressing. The base member 3 is manufactured by sintering the molded body in vacuum or a non-oxidizing atmosphere. A surface of the base member 3 may be then subjected to polishing process and honing process as desired.

Subsequently, a coating layer 5 is deposited on the surface of the base member 3 by chemical vapor deposition (CVD) method.

The first step is to deposit a layer 17 (underlayer) including titanium nitride in the first layer 13. A first mixed gas used as a reaction gas is manufactured by mixing 0.5-10 vol % of titanium tetrachloride gas and 10-60 vol % of nitrogen gas into hydrogen ($H_2$) gas. The layer 17 including titanium nitride is deposited in a temperature range of 830-870° C. by introducing the first mixed gas at a gas partial pressure of 10-20 kPa into a chamber.

The next step is to deposit a first region 19a in the first layer 13. A second mixed gas is manufactured by blending 0.5-10 vol % of titanium tetrachloride gas, 5-60 vol % of nitrogen gas and 0.1-3 vol % of acetonitrile gas into hydrogen gas. The first region 19a including MT-titanium carbonitride is deposited in a temperature range of 830-870° C. by introducing the second mixed gas at a gas partial pressure of 6-12 kPa into the chamber.

The next step is to deposit an intermediate layer 19c. A third mixed gas is manufactured by blending 3-30 vol % of titanium tetrachloride gas, 3-15 vol % of methane gas, 5-10 vol % of nitrogen gas and 0.5-10 vol % of carbon dioxide ($CO_2$) gas into hydrogen gas. The intermediate region 19c having a thickness of approximately 50-300 nm is deposited in a temperature range of 980-1050° C. by introducing the third mixed gas at a gas partial pressure of 6-12 kPa into the chamber. Voids 21 are formable in the intermediate region 19c because the third mixed gas includes carbon dioxide gas.

Additionally, the thickness of the intermediate region 19c is as small as approximately 50-300 nm, it becomes possible to align the voids 21 formed in the intermediate region 19c in a direction along the boundary 16 between the first layer 13 and the second layer 15.

The next step is to deposit a second region 19b in the first layer 13. A fourth mixed gas is manufactured by blending 1-4 vol % of titanium tetrachloride gas, 5-20 vol % of nitrogen gas, 0.1-10 vol % of methane gas and 0.5-10 vol % of carbon dioxide gas into hydrogen gas. The second region 19b having a thickness of approximately 0.3-3 μm and including HT-titanium carbonitride is deposited in a temperature range of 950-1050° C. by introducing the fourth mixed gas at a gas partial pressure of 5-45 kPa into the chamber.

The next step is to deposit a second layer 15. A deposition temperature is set to 950-1100° C., and a gas pressure is set to 5-20 kPa. A reaction gas composition is as follows. A fifth mixed gas is manufactured by blending 5-15 vol % of aluminum trichloride ($AlCl_3$) gas, 0.5-2.5 vol % of hydrogen chloride (HCl) gas, 0.5-5.0 vol % of carbon dioxide gas and 0-1 vol % of hydrogen sulfide ($H_2S$) gas into hydrogen gas. The second layer 15 is deposited by introducing the fifth mixed gas into the chamber.

Thereafter, as desired, a polishing process is carried out on a part of the surface of the deposited coating layer 5 at which the cutting edge 11 is located. If the polishing process is carried out, a workpiece is less likely to be welded onto the cutting edge 11, thus leading to the coated tool 1 having more excellent fracture resistance.

The above manufacturing method is a non-limiting embodiment of the method for manufacturing the coated tool 1. Hence, the coated tools 1 of the various non-limiting embodiments are not limited to ones which are manufactured by the above manufacturing method. For example, a third layer may be deposited separately on the second layer 15.

In order to manufacture the coated tool 1 in which an average value of the widths w1 of the voids 21 in the direction parallel to the first surface 7 is smaller than an average value of the distances w2 of the voids 21 adjacent to each other in the cross section orthogonal to the first surface 7, the carbon dioxide gas may be adjusted to 0.5-5 vol % during the deposition of the intermediate region 19c.

In order to manufacture the coated tool 1 in which an average value of the widths w1 of the voids 21 in the direction parallel to the first surface 7 is larger than an average value of the heights h1 of the voids 21 in the direction orthogonal to the first surface 7 in the cross section orthogonal to the first surface 7, time adjustment may be carried out during the deposition of the intermediate region 19c so that the intermediate region 19c is deposited in a thickness of approximately 50-150 nm.

In order to manufacture the coated tool 1 in which an average value of the distances d1 from the voids 21 to the boundary 16 is larger than an average value of the heights h1 of the voids 21 in the direction parallel to the first surface 7 in the cross section orthogonal to the first surface 7, time adjustment may be carried out during the deposition of the intermediate region 19c so as to be deposited in a thickness of approximately 50-150 nm, and thereafter the second region 19b in the first layer 13 may be deposited in a thickness of approximately 0.5-3 μm.

In order to manufacture the coated tool 1 in which an average value of the distances d1 from the voids 21 to the boundary 16 is larger than an average value of the distances w2 of the voids 21 adjacent to each other in the cross section orthogonal to the first surface, the second region 19b in the first layer 13 maybe deposited so as to be thicker than the average value of the distances w2 of the voids 21 adjacent to each other.

<Cutting Tool>

A cutting tool 101 of according to a non-limiting embodiment is described below with reference to the drawings.

Figure 6:
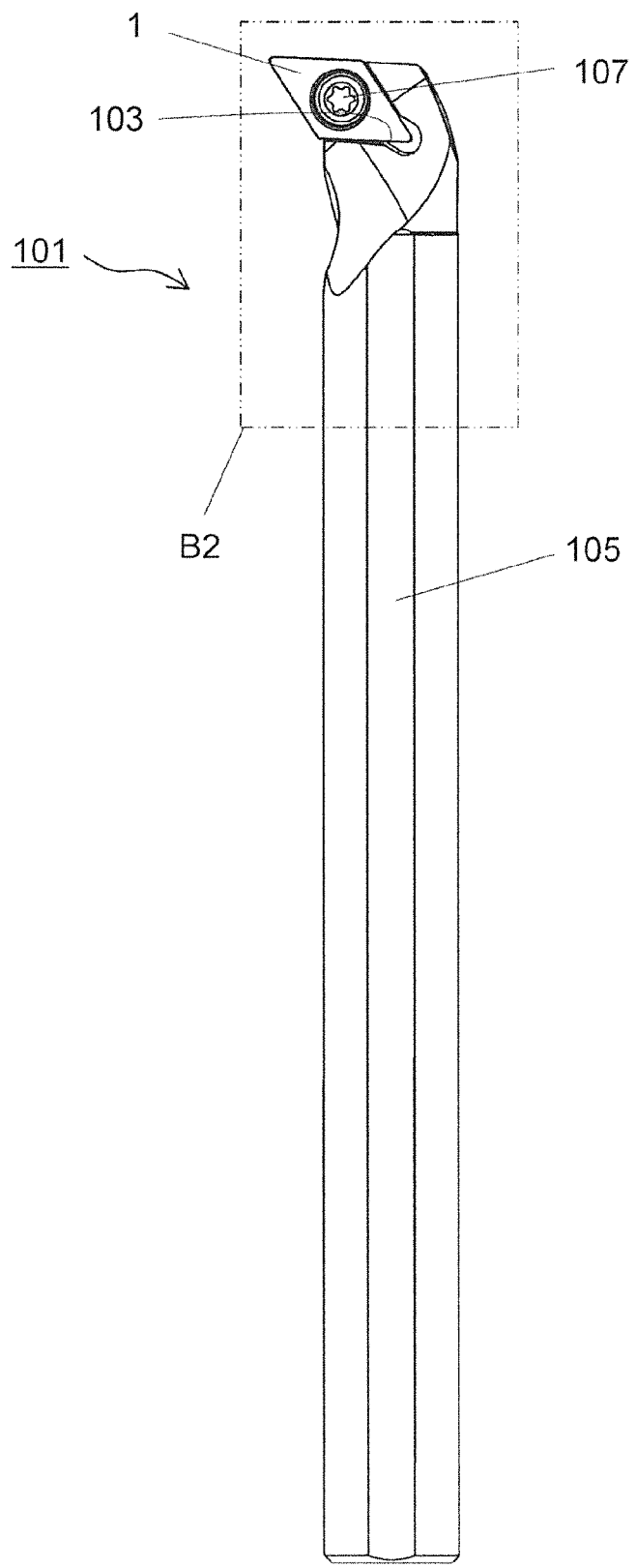
FIG. 6 is a plan view illustrating a cutting tool according to a non-limiting embodiment.
Figure 7:
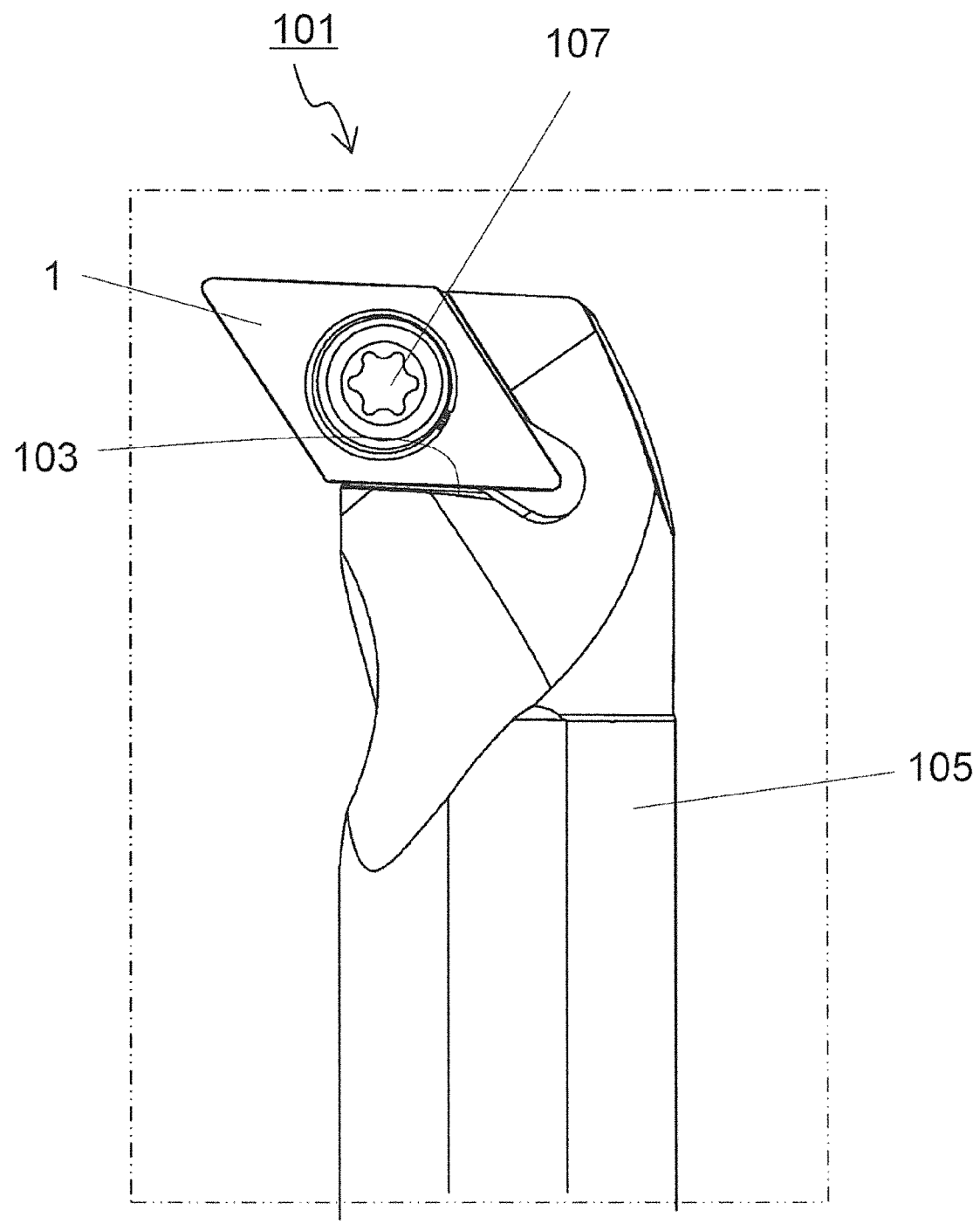
FIG. 7 is an enlarged view in a region B2 illustrated in FIG. 6.

As illustrated in FIGS. 6 and 7, the cutting tool 101 according to a non-limiting embodiment includes a bar-shaped body that extends from a first end (an upper side in FIG. 6) to a second end (a lower side in FIG. 6). The cutting tool 101 includes a holder 105 with a pocket 103 located at a side of the first end, and the coated tool 1 located at the pocket 103. In the cutting tool 101 according to a non-limiting embodiment, the coated tool 1 is attached so that a part of the ridge line which is usable as a cutting edge is protruded from a front end of the holder 105 in the cutting tool 101 according to a non-limiting embodiment.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located at the pocket 103. A lower surface of the coated tool 1 may be in a direct contact with the pocket 103. Alternatively, a sheet may be held between the coated tool 1 and the pocket 103.

The coated tool 1 is attached so that the part of the ridge line which is usable as the cutting edge is protruded outward from the holder 105. The coated tool 1 is attached to the holder 105 by a screw 107 according to a non-limiting embodiment. Specifically, the coated tool 1 is attached to the holder 105 in such a manner that screw parts are engaged with each other by inserting the screw 107 into the through hole of the coated tool 1, and by inserting a front end of the screw 107 into a screw hole (not illustrated) formed in the pocket 103.

For example, steel and cast iron are usable as the holder 105. Of these materials, high toughness steel may be used.

The non-limiting embodiments have been illustrated and described for the cutting tools for use in the so-called turning process. Examples of the turning process include inner diameter processing, outer diameter processing and grooving process. The cutting tools are not limited to ones which are used for the turning process. For example, the coated tools 1 of the above non-limiting embodiments are applicable to the cutting tools for use in the milling process.

Although the non-limiting embodiments in the present disclosure have been illustrated and described above, the present disclosure may not be limited thereto. It is, of course, possible to make any optional ones insofar as they do not depart from the gist of the present disclosure.

DESCRIPTION OF THE REFERENCE NUMERALS 1 coated tool
3 base member
5 coating layer
7 first surface
9 second surface
11 cutting edge
13 first layer
15 second layer
16 boundary (boundary between the first layer and second layer)
17 titanium nitride layer
19 titanium carbonitride layer
19a first region
19b second region
19c intermediate region
21 voids
23 through hole
101 cutting tool
103 pocket
105 holder
107 fixing screw

What is claimed is:

1. A coated tool, comprising:
a base member comprising a first surface;
and a coating layer located at least on the first surface of the base member,
wherein
the coating layer comprises: a first layer comprising a titanium compound and located on the first surface, and a second layer comprising an aluminum oxide and contactedly located on the first layer;
the first layer comprises:
a first region,
a second region located farther away from the base member than the first region, and
an intermediate region located between the first region and the second region; and
in a cross section orthogonal to the first surface, the coating layer further comprises a plurality of voids located side by side in the intermediate region in a direction along a boundary between the first layer and the second layer, and an average value of width of the plurality of voids in a direction parallel to the first surface is smaller than an average value of distance between the plurality of voids adjacent to each other in the direction parallel to the first surface.

2. The coated tool according to claim 1, wherein the first layer comprises titanium carbonitride, and the second layer comprises α-alumina.

3. The coated tool according to claim 1, wherein, in the cross section orthogonal to the first surface, an average value of width of the plurality of voids in a direction parallel to the first surface is larger than an average value of height of the plurality of voids in a direction orthogonal to the first surface.

4. The coated tool according to claim 1, wherein, in the cross section orthogonal to the first surface, an average value of distance from the plurality of voids to the boundary is larger than an average value of height of the plurality of voids in a direction orthogonal to the first surface.

5. The coated tool according to claim 1, wherein, in the cross section orthogonal to the first surface, an average value of distance from the plurality of voids to the boundary is larger than an average value of distance between the voids adjacent to each other in a direction parallel to the first surface.

6. A cutting tool, comprising:
a holder having a bar shape that extends from a first end to a second end, the holder comprising a pocket located at a side of the first end; and
the coated tool according to claim 1, which is located at the pocket.

7. A coated tool, comprising:
a base member comprising a first surface;
and a coating layer located at least on the first surface of the base member,
wherein
the coating layer comprises: a first layer comprising a titanium compound and located on the first surface, and a second layer comprising an aluminum oxide and contactedly located on the first layer; and
in a cross section orthogonal to the first surface, the coating layer further comprises a plurality of voids located side by side in the first layer in a direction along a boundary between the first layer and the second layer, and an average value of width of the plurality of voids in a direction parallel to the first surface is larger than an average value of height of the plurality of voids in a direction orthogonal to the first surface.

* * * * *